(12) United States Patent
Ogo et al.

(10) Patent No.: US 12,270,100 B2
(45) Date of Patent: Apr. 8, 2025

(54) TRANSFER APPARATUS AND FILM DEPOSITION APPARATUS USING TRANSFER APPARATUS

(71) Applicant: Shincron Co., Ltd., Yokohama (JP)

(72) Inventors: Yoshinori Ogo, Yokohama (JP); Takaaki Aoyama, Yokohama (JP)

(73) Assignee: SHINCRON CO., LTD., Yokohama (JP)

( * ) Notice: Subject to any disclaimer, the term of this patent is extended or adjusted under 35 U.S.C. 154(b) by 430 days.

(21) Appl. No.: 17/788,192

(22) PCT Filed: Jul. 30, 2020

(86) PCT No.: PCT/JP2020/029241
§ 371 (c)(1),
(2) Date: Jun. 22, 2022

(87) PCT Pub. No.: WO2022/024295
PCT Pub. Date: Feb. 3, 2022

(65) Prior Publication Data
US 2023/0123586 A1    Apr. 20, 2023

(51) Int. Cl.
*C23C 16/50* (2006.01)
*C23C 14/50* (2006.01)
*C23C 14/56* (2006.01)

(52) U.S. Cl.
CPC .......... *C23C 14/505* (2013.01); *C23C 14/568* (2013.01)

(58) Field of Classification Search
CPC ................. C23C 14/505; C23C 14/566; H01J 37/32899; H01J 37/32889; H01L 21/67196; H01L 21/67742; H01L 21/6719; H01L 21/68674
See application file for complete search history.

(56) References Cited

U.S. PATENT DOCUMENTS

| 6,196,154 | B1 | 3/2001 | Baumecker et al. |
| 2001/0001951 | A1 | 5/2001 | Schertler |
| 2012/0040128 | A1* | 2/2012 | Finn ........................ H01L 24/85 |
|  |  |  | 428/96 |

(Continued)

FOREIGN PATENT DOCUMENTS

| JP |   03115569 A | 5/1991 |
| JP |    9-92709 A | 4/1997 |
| JP | 2006-89800 A | 4/2006 |

(Continued)

*Primary Examiner* — Joseph A Miller, Jr.
(74) *Attorney, Agent, or Firm* — Muncy, Geissler, Olds & Lowe, P.C.

(57) ABSTRACT

To provide a highly productive, compact, and inexpensive film deposition apparatus while ensuring the stability of the film deposition quality, the apparatus includes a rotating body configured to be rotatable and provided with a holding unit that holds an object to be transferred in an attachable and detachable manner, the holding unit being provided along an outer peripheral portion of the rotating body; and a transfer mechanism having a gripping mechanism capable of gripping and releasing the object, the transfer mechanism transferring the object held by a predetermined device to the holding unit of the rotating body and transferring another object held by the rotating body to the predetermined device.

7 Claims, 18 Drawing Sheets

(56) References Cited

U.S. PATENT DOCUMENTS

2012/0234670 A1* 9/2012 Perego .................. C23C 14/568
                                                          204/192.1

FOREIGN PATENT DOCUMENTS

| JP | 2009-228062 A | 10/2009 |
| JP | 2016-69727 A | 5/2016 |
| TW | I683020 B | 1/2020 |

* cited by examiner

TRANSFER APPARATUS AND FILM DEPOSITION APPARATUS USING TRANSFER APPARATUS

TECHNICAL FIELD

The present invention relates to a transfer apparatus for transferring film deposition substrates and other objects and relates also to a film deposition apparatus using the transfer apparatus.

BACKGROUND ART

In film deposition apparatuses using a PVD method, a film deposition apparatus including a drum-shaped rotating body (also referred to as a carousel drum, hereinafter) that holds a plurality of film deposition substrates is known. In a film deposition apparatus including a carousel drum, it is necessary to attach the film deposition substrates before film deposition to the carousel drum and detach the film deposition substrates after film deposition from the carousel drum. Therefore, each time the film deposition step is completed, the film deposition chamber is opened, and the film deposition substrates on the carousel drum fixed in the film deposition chamber are sequentially replaced. A batch-type film deposition apparatus is known as that for performing a method of replacing the film deposition substrates. In the batch-type film deposition apparatus, the film deposition chamber is opened each time the film deposition step is completed; therefore, moisture may adsorb on the inner surface of the film deposition chamber to destabilize the film deposition quality, and at the same time, the productivity may be lowered because the evacuation time at the time of restarting the film deposition is prolonged.

To make up for the drawbacks of such a batch-type film deposition apparatus, a load-lock-type film deposition apparatus is known in which an auxiliary chamber such as a vacuum chamber is provided separately from the film deposition chamber, the carousel drum itself holding the film deposition substrates before film deposition is carried in from the auxiliary chamber to the film deposition change via a partition valve, and the carousel drum itself holding the film deposition substrates after film deposition is carried out from the film deposition chamber to the auxiliary chamber via the partition valve (Patent Document 1). This allows the film deposition substrates before film deposition and the film deposition substrates after film deposition to be replaced with each other while maintaining the degree of vacuum in the film deposition chamber.

PRIOR ART DOCUMENT

Patent Document

[Patent Document 1] JP2009-228062A

SUMMARY OF INVENTION

Problems to be Solved by Invention

In the load-lock-type film deposition apparatus described in Patent Document 1, however, the carousel drum itself has to be carried in from the auxiliary chamber to the film deposition chamber and carried out from the film deposition chamber to the auxiliary chamber; therefore, the partition valve which separates between the auxiliary chamber and the film deposition chamber is inevitably larger than the carousel drum, and the auxiliary chamber and the film deposition chamber are also larger accordingly. Therefore, there is a problem in that the evacuation time for the auxiliary chamber becomes long due to the increase in size of the auxiliary chamber, and the cost of the apparatus also increases.

That is, according to the conventional technique, it is not possible to provide a highly productive, compact, and inexpensive film deposition apparatus while ensuring the stability of the film deposition quality, and therefore the development of such an apparatus is desired.

A problem to be solved by the present invention is to provide a highly productive, compact, and inexpensive film deposition apparatus while ensuring the stability of the film deposition quality.

Means for Solving Problems

An aspect of the present invention solves the above problem by providing a transfer apparatus comprising: a rotating body configured to be rotatable and provided with a holding unit that holds an object to be transferred in an attachable and detachable manner, the holding unit being provided along an outer peripheral portion of the rotating body; and a transfer mechanism having a gripping mechanism capable of gripping and releasing the object, the transfer mechanism transferring the object held by a predetermined device to the holding unit of the rotating body and transferring another object held by the rotating body to the predetermined device.

Another aspect of the present invention solves the above problem by providing a film deposition apparatus comprising: the above transfer apparatus; a film deposition chamber that has a holder for holding an object and applies a predetermined surface treatment to the object held by the holder; and an auxiliary chamber that is spatially isolated from the film deposition chamber via a partition valve, wherein the transfer apparatus is provided in the auxiliary chamber, and the transfer mechanism transfers the object held by the holder to the holding unit of the rotating body and transfers another object held by the rotating body to the holder.

Effect of Invention

By using the transfer apparatus according to the present invention for the film deposition apparatus, it is possible to provide a highly productive, compact, and inexpensive film deposition apparatus while ensuring the stability of the film deposition quality.

MODE(S) FOR CARRYING OUT THE INVENTION

FIGS. 4A to 7 illustrate an embodiment of a transfer apparatus according to the present invention. Hereinafter, one or more embodiments in which the transfer apparatus is applied to a film deposition apparatus will be described, but the transfer apparatus according to the present invention is not limited to being applied to a film deposition apparatus and can be used for any other apparatus. The following embodiments will be described on the assumption that the object which is a transfer object of the transfer apparatus of the present invention is a film deposition substrate 3, but an object other than the film deposition substrate may be the transfer object.

Figure 1:
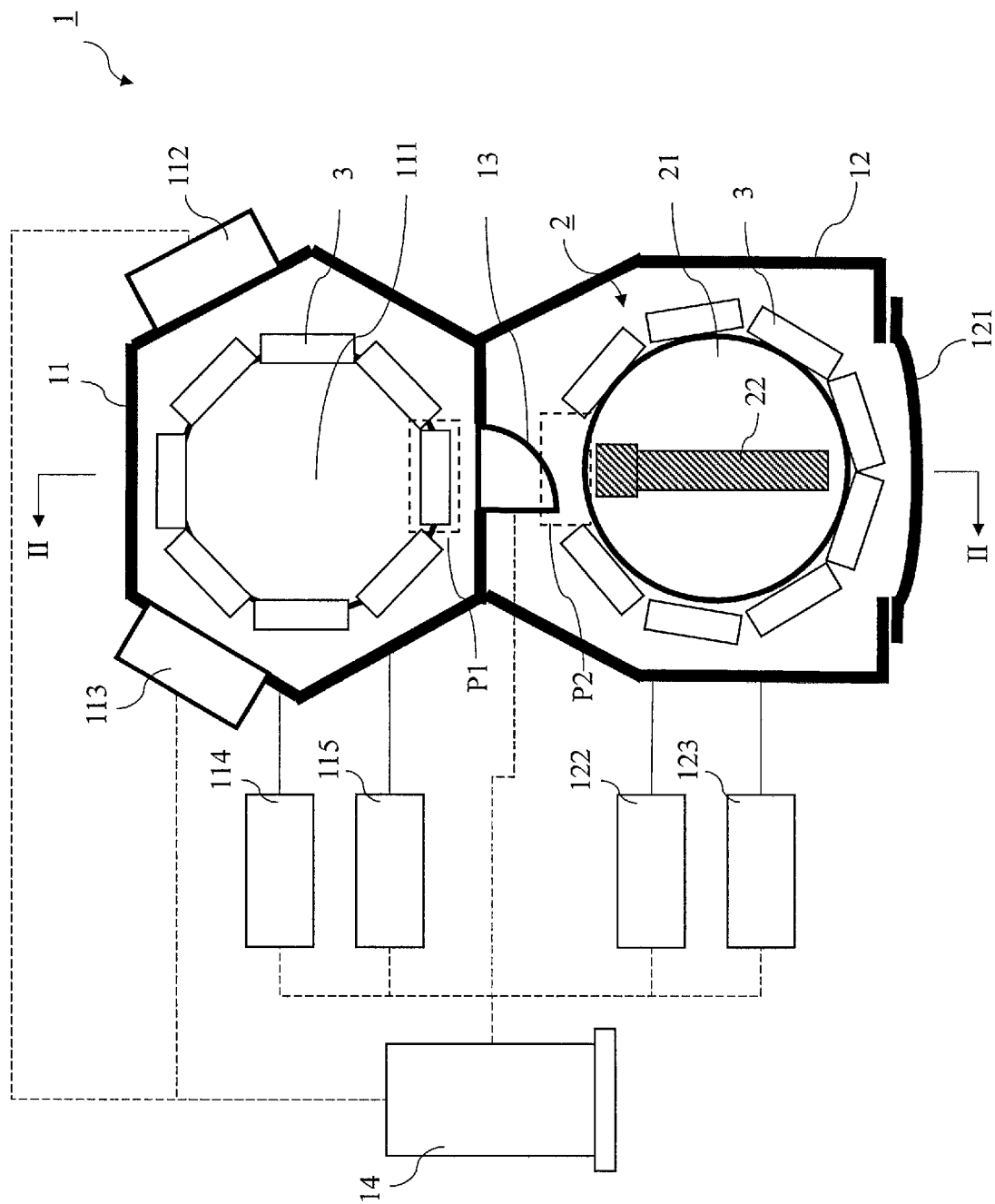
FIG. 1 is a plan view illustrating an embodiment of a film deposition apparatus using a transfer apparatus according to the present invention.
Figure 2:
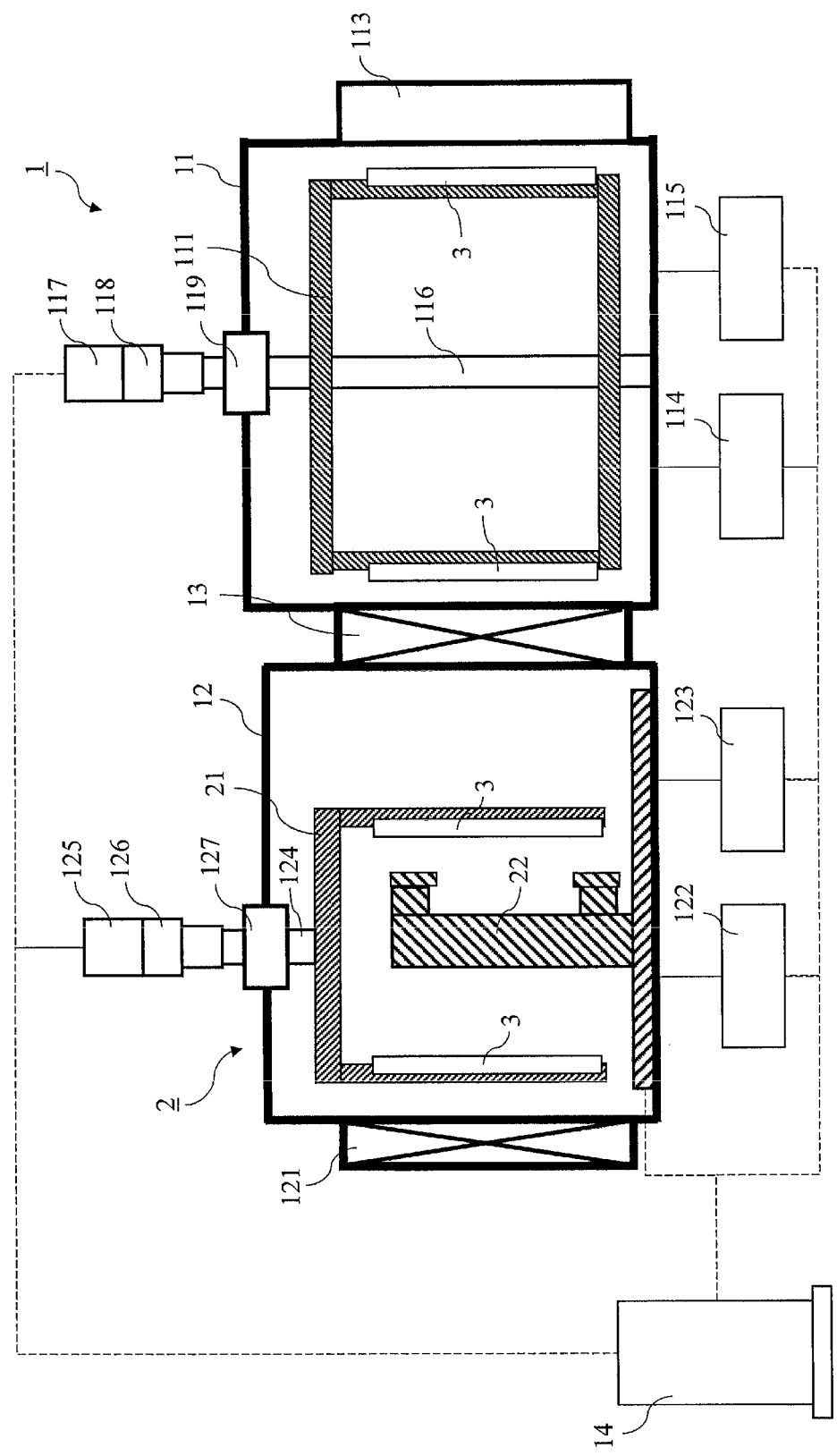
FIG. 2 is a cross-sectional view taken along the line II-II of FIG. 1.

FIG. 1 is a plan view illustrating an embodiment of a film deposition apparatus 1 using the transfer apparatus according to the present invention and FIG. 2 is a cross-sectional view taken along the line II-II of FIG. 1. The film deposition apparatus 1 of the present embodiment includes a film deposition chamber 11 composed of a housing that is substantially a closed space, an auxiliary chamber 12 composed of a housing that is also substantially a closed space, and a partition valve 13 that opens and closes the film deposition chamber 11 and the auxiliary chamber 12 in an airtight manner.

The film deposition chamber 11 of the present embodiment is provided with a carousel drum 111 that is a drum-shaped rotating body. The carousel drum 111 is configured to be rotatable around a drum shaft 116 supported between the ceiling and floor of the film deposition chamber 11. A servomotor 117 is connected to one end of the drum shaft 116 via a decelerator 118, and the servomotor 117 continuously rotates the carousel drum 111 at a constant speed or subjects the carousel drum 111 to index rotation at a constant dimension. The servomotor 117 is controlled by a control device 14, which will be described later. A magnetic seal unit 119 is provided at a portion at which the drum shaft 116 penetrates the ceiling of the film deposition chamber 11, and ensures the airtightness of the film deposition chamber 11.

The shape, material, etc. of the carousel drum 111 are not particularly limited, but the carousel drum 111 of the present embodiment has a configuration in which film deposition substrates 3 (each corresponding to the object of the present invention) can be held side by side on the cylindrical side surface so that desired thin films are deposited on the surfaces of the film deposition substrates 3. In the carousel drum 111 illustrated in FIG. 1, eight film deposition substrates 3 can be held, but the number of the film deposition substrates 3 to be held is not particularly limited. The specific holding structure will be described later.

The film deposition chamber 11 of the present embodiment is provided with sputtering electrodes 112 and 113 for performing film deposition by a sputtering method. The sputtering electrodes 112 and 113 are controlled by the control device 14, which will be described later. The film deposition apparatus 1 of the present embodiment is described as a film deposition apparatus that performs a sputtering-based film deposition method, but the film deposition apparatus according to the present invention is not limited in the film deposition method and may perform various vapor-based film deposition methods such as vacuum vapor deposition, molecular beam vapor deposition, ion plating, and ion beam vapor deposition or various types of surface treatment, such as magnetron sputtering, ion beam sputtering, ECR sputtering, reactive sputtering, plasma-induced CVD method, ALD method, and bias etching. In the case of a sputtering-based film deposition apparatus, the sputtering scheme is not limited, and various sputtering-based film deposition methods may be used.

For example, in the case of magnetron sputtering, the sputtering electrodes 112 and 113 include a pair of magnetron sputtering electrodes and an AC power source connected via a transformer, and targets as the film deposition materials are attached to the tips of the magnetron sputtering electrodes. The sputtering electrodes 112 and 113 are fixed to the film deposition chamber 11 in such a posture that the surface of each target faces a film deposition substrate 3 held on the side wall surface of the carousel drum 111. In the embodiment illustrated in FIG. 1, two sputtering electrodes 112 and 113 are provided, but the number of sputtering electrodes is not limited and may be one or three or more.

The film deposition chamber 11 of the present embodiment is provided with an evacuation device 114 for adjusting the inside of the film deposition chamber 11 to a predetermined degree of vacuum and a gas supply device 115 for introducing an inert gas such as argon and a reaction gas such as oxygen into the film deposition chamber 11. The evacuation device 114 and the gas supply device 115 are controlled by the control device 14, which will be described later. Examples of the evacuation device 114 include a rotary pump, a dry pump, a turbo molecular pump (TMP), and a cryopump (CP). Additionally or alternatively, the film deposition chamber 11 may be provided with a Meissner mechanism for gas evacuation.

One side wall surface of the film deposition chamber 11 is provided with the auxiliary chamber 12 in communication with the film deposition chamber 11 via the partition valve 13. The partition valve 13 is controlled to open and close by the control device 14, which will be described later. When the partition valve 13 is closed, the film deposition chamber 11 becomes a closed space, and when the partition valve 13 is opened, the film deposition chamber 11 and the auxiliary chamber 12 have the same atmospheric pressure. For example, during the film deposition process, the partition valve 13 is closed to make the inside of the film deposition chamber 11 a closed space, while when the film deposition process is completed, the partition valve 13 is opened to release a film deposition substrate 3, for which the film deposition is completed, from the carousel drum 111 and set on the carousel drum 111 a film deposition substrate 3 before film deposition.

The auxiliary chamber 12 of the present embodiment is provided with an airtight door 121 that opens and closes the auxiliary chamber 12 in an airtight manner. The airtight door 121 is opened when a film deposition substrate 3 before film deposition that is to be attached to the rotating body 21, which will be described later, is carried into the auxiliary chamber 12 or when a film deposition substrate 3 attached to the rotating body 21 is carried out from the auxiliary chamber 12 to the air atmosphere side. During other film deposition processes or when a film deposition substrate 3 is replaced, the airtight door 121 is closed to ensure the airtightness inside the auxiliary chamber 12 thereby to control the atmospheric pressure in the auxiliary chamber 12. It suffices that the size of the airtight door 121 is such that it has the smallest opening through which a film deposition substrate 3, which will be described later, can pass, and this can suppress the increase in size of the auxiliary chamber 12. Opening the airtight door 121 to attach a film deposition substrate 3 to the rotating body 21 and detach a film deposition substrate 3 from the rotating body 21 is performed by a transfer robot or the like (not illustrated) that is provided on the air atmosphere side of the auxiliary chamber 12.

The auxiliary chamber 12 of the present embodiment has an evacuation device 122 for making the inside of the auxiliary chamber 12 a predetermined vacuum pressure and a leak valve 123 for returning the pressure from the vacuum state to the atmospheric air pressure and is controlled by the control device 14, which will be described later. Examples of the evacuation device 122 include a rotary pump, a dry pump, a turbo molecular pump (TMP), and a cryopump (CP) as in the case of the evacuation device 114 of the film deposition chamber 11. The auxiliary chamber 12 and the film deposition chamber 11 can be operated at independent pressures because these chambers are separated by the partition valve 13. Accordingly, during the film deposition operation in the film deposition chamber 11, the evacuation device 122 and the leak valve 123 can be operated to open the auxiliary chamber to the atmosphere to perform the replacement operation on the film deposition substrates 3 and the vacuum evacuation after the replacement and can be prepared for the replacement operation on the film deposition substrates 3 for the next batch. The evacuation time at the time of resuming the film deposition can be remarkably shortened as compared with the batch-type film deposition apparatus, and it can thus be said that the productivity is high.

Although not particularly limited, the auxiliary chamber 12 may be provided with a mechanism for performing surface treatment, and additional surface treatment may be performed in the auxiliary chamber 12 before and/or after the film deposition process performed in the film deposition chamber 11. For example, a resistance heating mechanism may be provided to perform a vapor deposition process for an organosilane compound, a plasma generator may be provided to perform plasma pretreatment, a metal target may be provided to perform metal film sputtering, and/or heat-degassing treatment may be performed on the film deposition surfaces of the film deposition substrates 3. In such a case, it is preferred that the rotating body 21 can be accelerated to a constant rotation speed of 10 rpm or more by the servomotor 125 or the like.

Figure 3A:
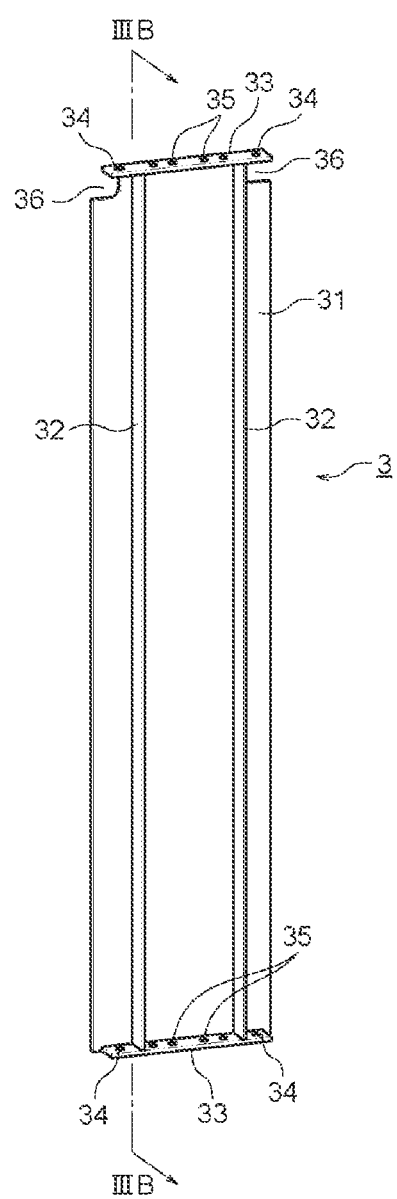
FIG. 3A is a perspective view illustrating an example of an object according to the present invention.
Figure 3B:
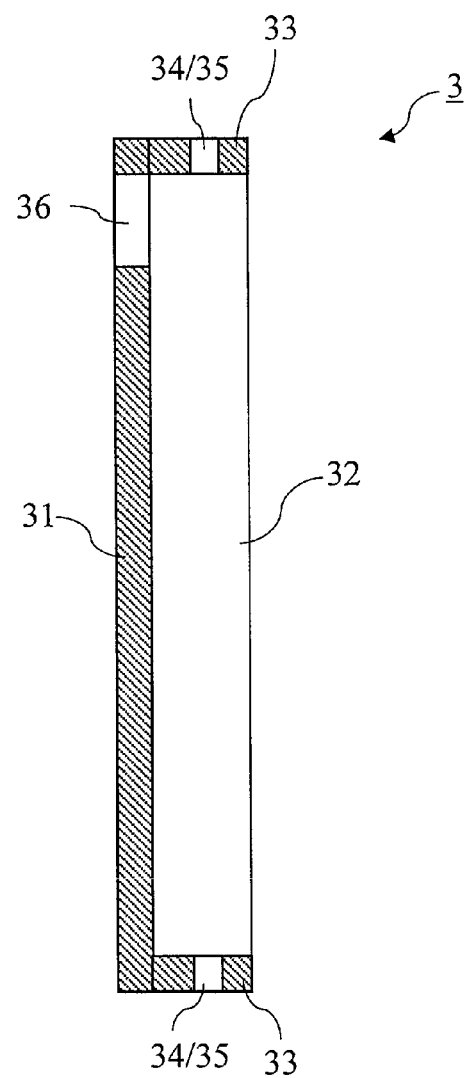
FIG. 3B is a cross-sectional view taken along the line IIIB-IIIB of FIG. 3A.

Here, an example of a film deposition substrate 3 that is an embodiment of the object according to the present invention will be described. FIG. 3A is a perspective view illustrating an example of a film deposition substrate 3 corresponding to the object according to the present invention and FIG. 3B is a cross-sectional view taken along the line IIIB-IIIB of FIG. 3A. The film deposition substrate 3 of the present embodiment has a flat plate-shaped main body 31, and its front surface side serves as a film deposition surface. The hidden surface on the opposite side of the main body 31 illustrated in FIG. 3A is the front surface (film deposition surface), and the visible surface on the near side is the back surface. Two first ribs 32 extend in parallel along the longitudinal direction and are fixed to the back surface of the main body 31, and two second ribs 33 extend in parallel along the lateral direction and are fixed at the upper end and lower end of the back surface of the main body 31. A film is deposited directly on the front surface of the main body 31 of the present embodiment, but another film deposition body on which a film is deposited may be fixed to the front surface of the main body 31. The first ribs 32 and second ribs 33 in this case are configured in the same manner as illustrated in FIGS. 3A and 3B.

The film deposition substrate 3 of the present embodiment is held on the side wall surface of the carousel drum 111 of the film deposition chamber 11 in an attachable and detachable manner and also held by holding units 212 of the rotating body 21 of the auxiliary chamber 12 in an attachable and detachable manner. To this end, both end portions of the second ribs 33 are formed with a total of four respective first holes 34. Pins (not illustrated) of the carousel drum 111 are engaged with the first holes 34, and pins 214 of the rotating body 21 are also engaged with the first holes 34. Details of this engagement structure will be described later. In addition, when the film deposition substrate 3 is attached to or detached from the carousel drums 111 or attached to or detached from the holding units 212 of the rotating body 21, it is necessary to grip the film deposition substrate 3. Central portions of the second ribs 33 are therefore formed with a total of four respective second holes 35. Pins 228 of a transfer mechanism 22, which will be described later, engage with the second holes 35. Details of this engagement structure will be described later.

The upper end portion of the main body 31 of the film deposition substrate 3 is formed with cutout portions 36. The cutout portions 36 are spaces for avoiding interference between plates 213 of the holding units 212 and the main body 31 when the film deposition substrate 3 is attached to or detached from the rotating body 21. A height dimension H1 of the cutout portions 36 is therefore set to be a cutout length of an engagement length H2 or more between the pins 214 and the first holes 34 as illustrated in the middle figure of FIG. 5.

Figure 4A:
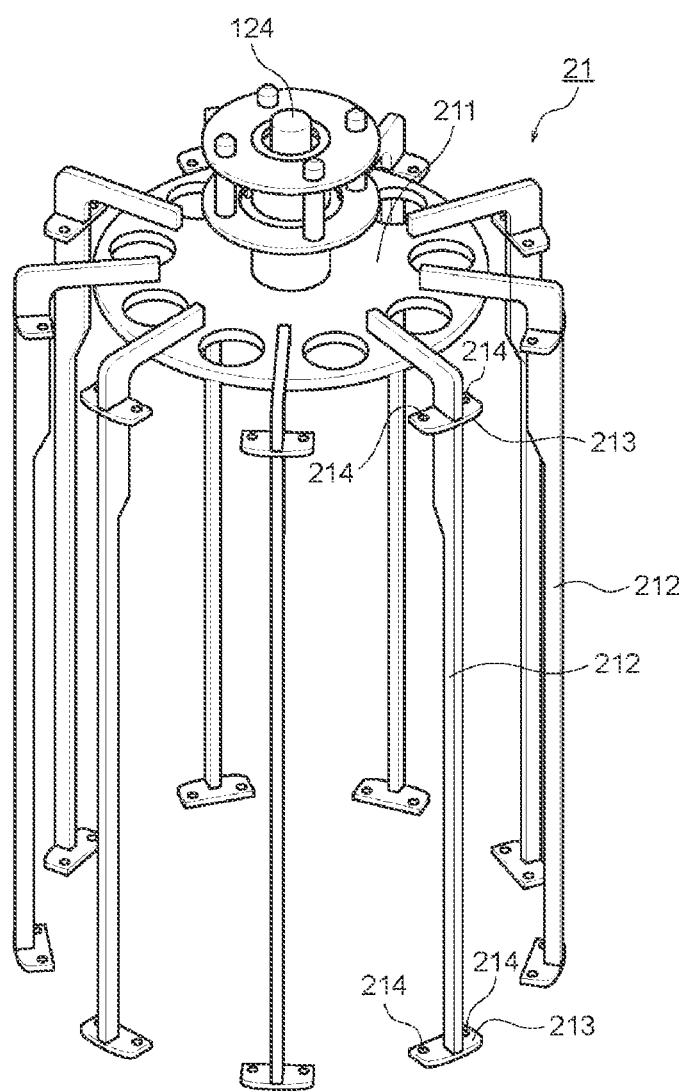
FIG. 4A is a perspective view illustrating an example of a rotating body according to the present invention.
Figure 4B:
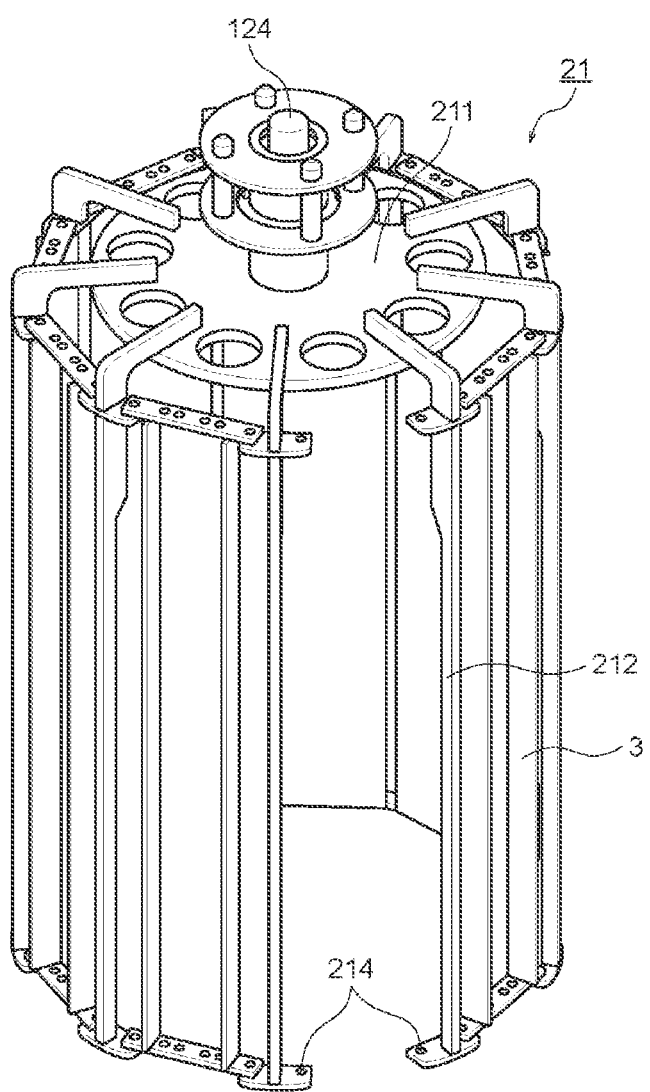
FIG. 4B is a perspective view illustrating a state in which objects are attached to the rotating body of FIG. 4A.
Figure 5:
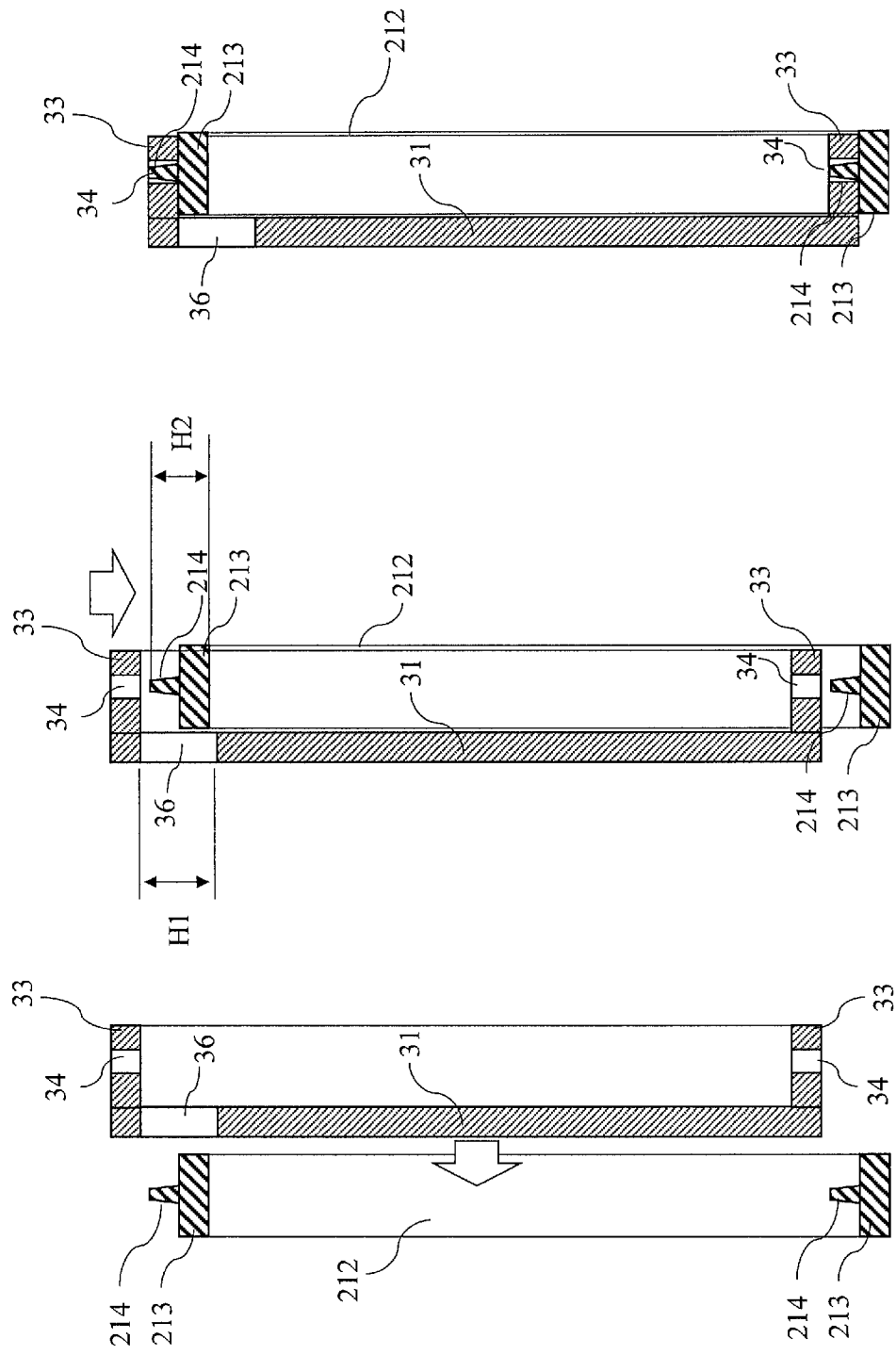
FIG. 5 is a set of cross-sectional views illustrating a method of attaching an object to the rotating body.
Figure 6A:
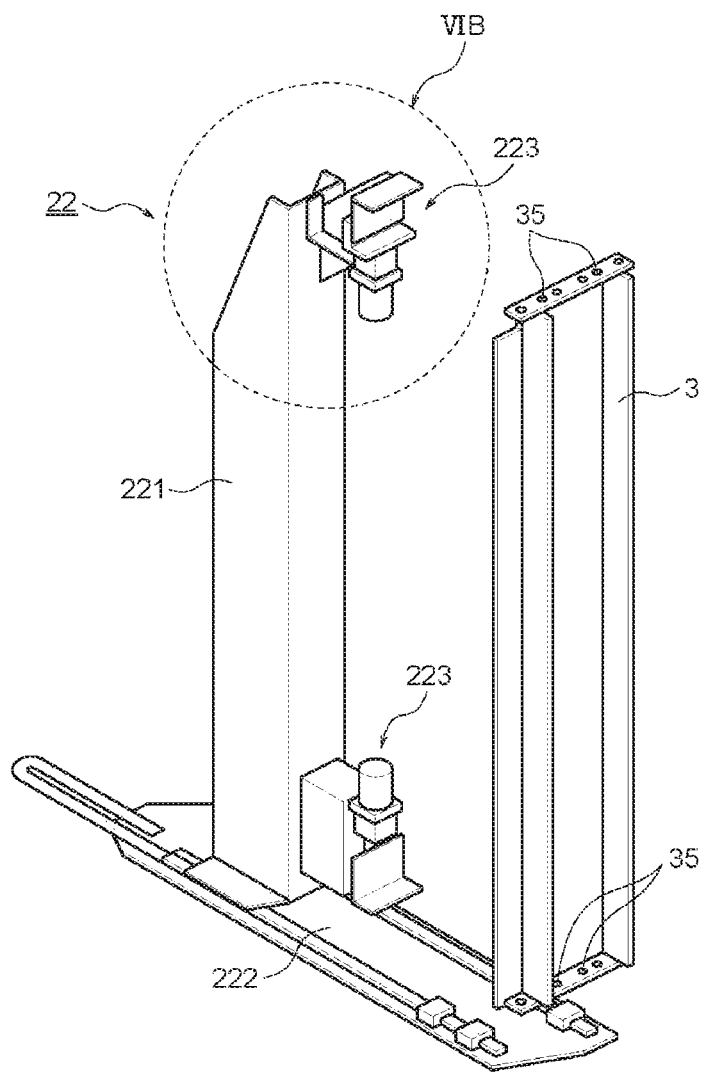
FIG. 6A is a perspective view illustrating an example of a transfer mechanism according to the present invention.

The rotating body 21 and the transfer mechanism 22 are provided in the auxiliary chamber 12 of the present embodiment. Inclusion of the rotating body 21 and the transfer mechanism 22 is also referred to as a transfer apparatus 2. FIGS. 4A to 5 illustrate the rotating body 21 and FIGS. 6A to 7 illustrate the transfer mechanism 22. FIG. 4A is a perspective view illustrating an example of the rotating body 21 according to the present invention, FIG. 4B is a perspective view illustrating a state in which the film deposition substrates 3 which are objects are attached to the rotating body 21 of FIG. 4A, and FIG. 5 is a set of cross-sectional views illustrating a method of attaching a film deposition substrate 3 that is the object to the rotating body 21.

The auxiliary chamber 12 of the present embodiment is provided with the rotating body 21 which is configured to be rotatable. The rotating body 21 of the present embodiment has a rotating body main body 211 formed in a circular disk shape and a plurality of holding units 212 provided to suspend vertically along the outer peripheral portion of the rotating body main body 211. As illustrated in FIG. 2, the rotating body main body 211 is configured to be rotatable around a rotating body shaft 124 that is cantilevered and supported on the ceiling of the auxiliary chamber 12. A servomotor 125 is connected to the upper end of the rotating body shaft 124 via a decelerator 126, and the servomotor 125 continuously rotates the rotating body 21 at a constant speed or subjects the rotating body 21 to index rotation at a constant dimension. The servomotor 125 is controlled by the control device 14, which will be described later. A magnetic seal unit 127 is provided at a portion at which the rotating body shaft 124 penetrates the ceiling of the auxiliary chamber, and ensures the airtightness of the auxiliary chamber 12.

A pair of plates 213 are fixed to each of the holding units 212 illustrated in FIG. 4A at an interval corresponding to the length of the film deposition substrates 3 in the longitudinal direction, and the upper surface of each plate 213 is provided with two pins 214 that project upward. The pins 214 engage with the first holes 34 of a film deposition substrate 3. Nine holding units 212 illustrated in FIG. 4A are provided on the rotating body main body 211, and one film deposition substrate 3 can be held in each gap between two adjacent holding units 212. The rotating body 21 has a uniaxial structure in which the rotating body shaft 124 suspends in the vertical direction, and the holding units 212 are provided to suspend vertically from the outer peripheral portion of the rotating body 21; therefore, a space through which the transfer mechanism 22 to be described later can pass is formed between the lower ends of the holding units 212 and the floor surface of the auxiliary chamber 12.

To attach a film deposition substrate 3 to holding units 212 of the rotating body 21, the film deposition substrate 3 may be moved as illustrated in the left figure, middle figure, and right figure of FIG. 5 in this order. In FIG. 5, the vertical positions of the holding units 212 of the rotating body 21 are fixed and do not move, and the film deposition substrate 3 moves up and down and back and forth. First, as illustrated in the left figure of FIG. 5, the film deposition substrate 3 is gripped so as to be slightly higher than the holding units 212 and is positioned so that the second rib 33 on the upper side of the film deposition substrate 3 is above the plates 213 and pins 214 on the upper side of the holding units 212 while the second rib 33 on the lower side of the film deposition substrate 3 is above the plates 213 and pins 214 on the lower side of the holding units 212. From this state, the film deposition substrate 3 is brought close to the holding units 212 and moved to a position at which the pins 214 on the upper side of the holding units 212 can engage with the first holes 34 on the upper side of the film deposition substrate 3 while the pins 214 on the lower side of the holding units 212 can engage with the first holes 34 on the lower side of the film deposition substrate 3. This state is illustrated in the middle figure of FIG. 5. When the film deposition substrate 3 is moved from the state of the left figure of FIG. 5 to the state of the middle figure of FIG. 5, the plates 213 and pins 214 on the upper side of the holding units 212 pass through the cutout portions 36 of the film deposition substrate 3. The existence of the cutout portions 36 allows the film deposition substrate 3 to be attached without interfering with the holding units 212.

After the film deposition substrate 3 is moved to the position of the middle figure of FIG. 5, the film deposition substrate 3 is moved downward so that the pins 214 on the upper side of the holding units 212 are engaged with the first holes 34 on the upper side of the film deposition substrate 3 while the pins 214 on the lower side of the holding units 212 are engaged with the first holes 34 on the lower side of the film deposition substrate 3. This state is illustrated in the right figure of FIG. 5. This allows the film deposition substrate 3 to be held by the holding units 212.

To release the film deposition substrate 3 from the state illustrated in the right figure of FIG. 5, the film deposition substrate 3 may be moved in the opposite direction as illustrated in the right figure, middle figure, and left figure of FIG. 5 in this order. That is, the film deposition substrate 3 is moved upward from the state illustrated in the right figure of FIG. 5, and the pins 214 on the upper side of the holding units 212 are pulled out from the first holes 34 on the upper side of the film deposition substrate 3 while the pins 214 on the lower side of the holding units 212 are pulled out from the first holes 34 on the lower side of the film deposition substrate 3. This state is a state illustrated in the middle figure of FIG. 5. Then, from the state illustrated in the middle figure of FIG. 5, the film deposition substrate 3 is moved rightward in FIG. 5 so that the plates 213 and pins 214 on the upper side of the holding units 212 pass through the cutout portions 36 of the film deposition substrate 3. This leads to the state illustrated in the left figure of FIG. 5, and the film deposition substrate 3 is released from the holding units 212.

The carousel drum 111 provided in the film deposition chamber 11 is also provided with holding units having the same structures as those of the holding units 212 of the rotating body 21. The carousel drum 111 is provided with eight holding units, and as illustrated in FIG. 1, eight film deposition substrates 3 can be held in the gaps between adjacent holding units. As such, the operations for attaching the film deposition substrate 3 as illustrated in the left figure, middle figure, and right figure of FIG. 5 in this order are performed when a film deposition substrate 3 before film deposition is attached to holding units of the carousel drum 111 and when a film deposition substrate 3 after film deposition is attached to holding units 212 of the rotating body 21. On the other hand, the operations for releasing the film deposition substrate 3 as illustrated in the right figure, middle figure, and left figure of FIG. 5 in this order are performed when a film deposition substrate 3 before film deposition is released from holding units 212 of the rotating body 21 and when a film deposition substrate 3 after film deposition is released from holding units of the carousel drum 111.

FIG. 4B illustrates a state in which eight film deposition substrates 3 are attached to the holding units 212 of the rotating body 21, but one of the nine gaps formed between the nine holding units 212 is vacant without an attached film deposition substrate 3. This is to attach a film deposition substrate 3 after film deposition that is released from the carousel drum 111.

In the auxiliary chamber 12 of the present embodiment, the transfer mechanism 22 having gripping mechanisms 223 that can grip and release a film deposition substrate 3 is provided inside a space surrounded by the holding units 212 of the rotating body 21. The transfer mechanism 22 transfers a film deposition substrate 3 after film deposition that is held by holding units of the carousel drum 111 to holding units 212 of the rotating body 21 and transfers a film deposition substrate 3 before film deposition that is held by holding units 212 of the rotating body 21 to holding units of the carousel drum 111. FIG. 6A is a perspective view illustrating an example of the transfer mechanism 22 according to the present invention, FIG. 6B is an enlarged side view illustrating the VIB portion of FIG. 6A, and FIG. 7 is a set of cross-sectional views illustrating a method of gripping a film deposition substrate 3 by the transfer mechanism 22.

The transfer mechanism 22 of the present embodiment includes a transfer mechanism main body 221 formed in a column shape, a linear slider 222 that linearly moves the transfer mechanism main body 221 back and forth, and a gripping mechanism 223 provided at each of the upper portion and lower portion of the transfer mechanism main body 221. The linear slider 222 extends along a straight line connecting between transfer positions P1 and P2 illustrated in the plan view of FIG. 1 and is configured to be able to move the transfer mechanism main body 221 back and forth and stop it at an arbitrary position.

Figure 6B:
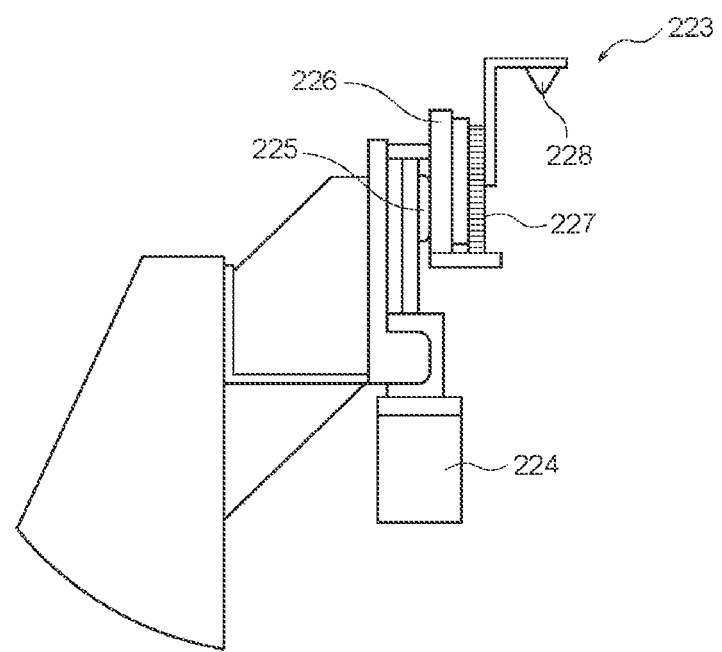
FIG. 6B is an enlarged side view illustrating the VIB portion of FIG. 6A.
Figure 7:
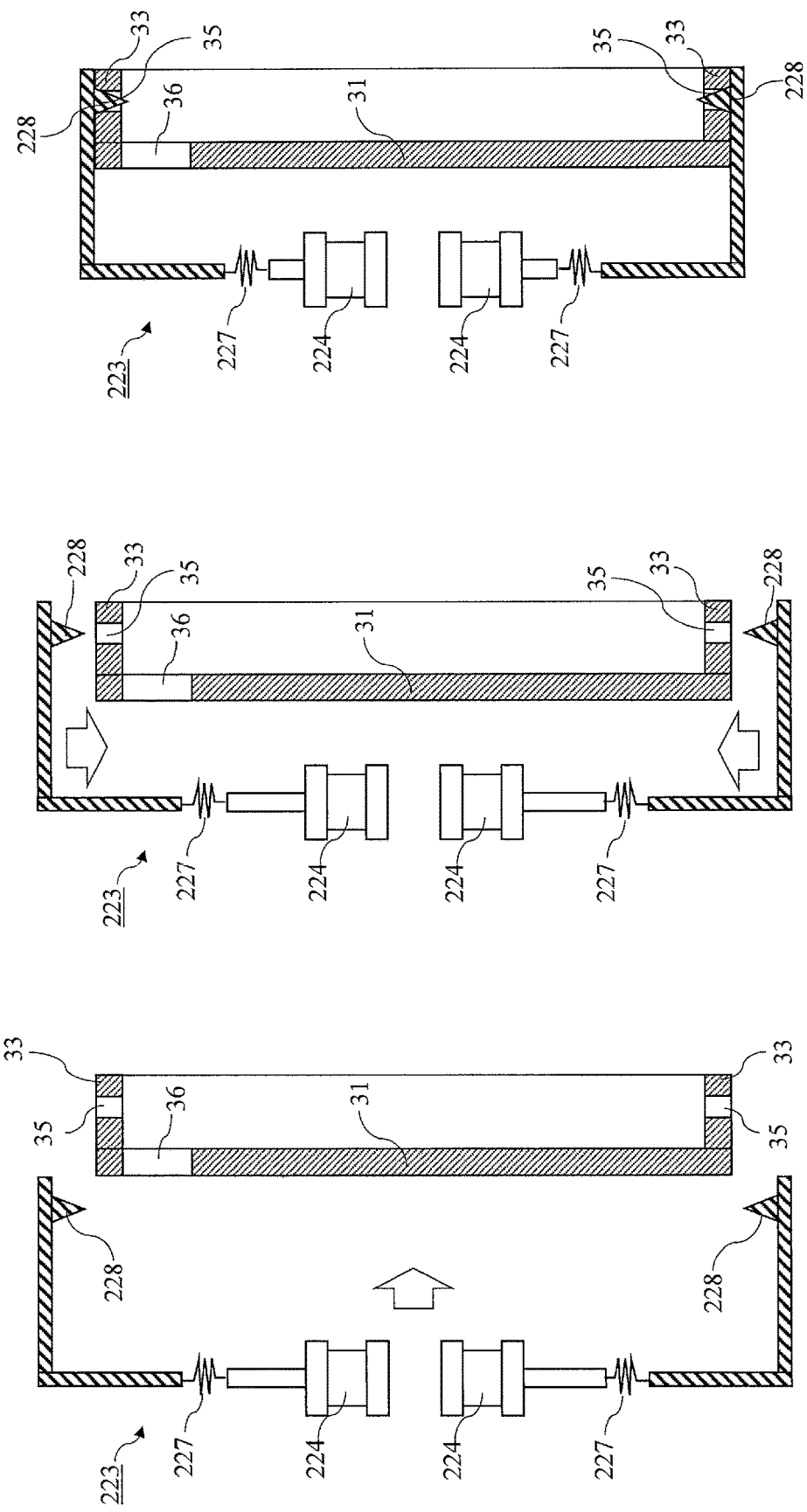
FIG. 7 is a set of cross-sectional views illustrating a method of gripping an object by the transfer mechanism of FIG. 6A.

As illustrated in FIG. 6B, the gripping mechanism 223 on the upper side of the transfer mechanism main body 221 has a vacuum motor 224, an actuator unit 225, and a slider 226. The vacuum motor 224 is fixed to the transfer mechanism main body 221 and the slider 226 is fixed to a linear guide in the actuator unit 225. The rotational motion of an output shaft of the vacuum motor 224 in both directions is converted into a linear reciprocating motion by the actuator unit 225 including a ball screw and a bearing support, and the slider 226 thereby reciprocates with respect to the transfer mechanism main body 221. The slider 226 is provided with a pin 228 via a shock absorbing spring 227, and the pin 228 engages with the second hole 35 of a film deposition substrate 3. By controlling the drive of the two vacuum motors 224 in synchronization, the operation of gripping/releasing a film deposition substrate 3 with the pair of pins 228 and the operation of raising/lowering the film deposition substrate 3 while gripping it are executed. FIG. 6B illustrates the upper gripping mechanism 223 of FIG. 6A while the lower gripping mechanism 223 illustrated in FIG. 6A is configured to be vertically symmetrical with the upper gripping mechanism 223 illustrated in FIG. 6B.

FIG. 7 is a set of cross-sectional views illustrating a method of gripping a film deposition substrate 3 by the transfer mechanism 22 of FIG. 6A. The film deposition substrate 3 is gripped by operating the gripping mechanisms 223 of the transfer mechanism 22 in the order of the left figure, middle figure, and right figure of FIG. 7, and conversely, the film deposition substrate 3 is released by operating the gripping mechanisms 223 of the transfer mechanism in the order of the right figure, middle figure, and left figure of FIG. 7. When gripping the film deposition substrate 3 by the gripping mechanisms 223, first, in a state in which the pair of upper and lower pins 228 of the gripping mechanisms 223 are in the open positions (non-clamping positions) as illustrated in the left figure of FIG. 7, the transfer mechanism main body 221 is brought close to the film deposition substrate 3 by the linear slider 222, and the transfer mechanism main body 221 is stopped at a position at which the pins 228 face the second holes 35 of the film deposition substrate 3 as illustrated in the middle figure of FIG. 7.

Then, from the state illustrated in the middle figure of FIG. 7, the pair of upper and lower vacuum motors 224 are synchronously driven to bring the pair of upper and lower sliders 226 close to each other, and the pins 228 of the gripping mechanisms 223 are engaged with the second holes 35 of the film deposition substrate 3 (the positions of the pins 228 will also be referred to as closed positions (cramping positions) of the pins 228). At this time, springs 227 interposed between the rods and the pins 228 extend thereby to allow the upper gripping mechanism 223 to elastically bias the film deposition substrate 3 downward and also allow the lower gripping mechanism 223 to elastically bias the film deposition substrate 3 upward. Through this operation, the impact when the film deposition substrate 3 is gripped by the gripping mechanisms 223 can be absorbed and the gripping mechanisms 223 can firmly grip the film deposition substrate 3. The gripping of the film deposition substrate 3 is completed by the above operations, but when the film deposition substrate 3 is raised or lowered in this gripped state, the pair of upper and lower vacuum motors 224 may be synchronously driven to move the pair of upper and lower sliders 226 in the same direction (upward or downward).

On the contrary, when releasing the gripped film deposition substrate 3, first, as illustrated in the right figure of FIG. 7, the pair of upper and lower vacuum motors 224 are synchronously driven to separate the pair of upper and lower sliders 226 from each other, and as illustrated in the middle figure of FIG. 7, the pins 228 of the gripping mechanisms 223 are pulled out from the second holes 35 of the film deposition substrate 3. Then, the linear slider 222 is used to move the transfer mechanism main body 221 in the direction away from the film deposition substrate 3 into a state illustrated in the left figure of FIG. 7.

Referring again to FIG. 1, the control device 14 of the present embodiment is a control device that performs overall control of the film deposition apparatus 1, and as described above, controls the evacuation device 114 to set/adjust the atmospheric pressure in the film deposition chamber 11. The control device 14 also controls the gas supply device 115 to set/adjust various conditions such as the supply timing and supply amount of the inert gas and reaction gas supplied to the inside of the film deposition chamber 11. The control device 14 further controls the servomotor 117 to set/adjust the rotation ON/OFF of the carousel drum 111 of the film deposition chamber 11, the constant speed rotation/intermittent rotation/constant dimension rotation or other rotation scheme, and the rotation speed.

Likewise, the control device 14 controls the evacuation device 122 to set/adjust the atmospheric pressure in the auxiliary chamber 12. The control device 14 also controls the gas supply device 123 to set/adjust various conditions such as the supply timing and supply amount of the inert gas and reaction gas supplied to the inside of the auxiliary chamber 12. The control device 14 further controls the servomotor 125 to set/adjust the rotation ON/OFF of the rotating body 21 of the auxiliary chamber 12, the constant speed rotation/intermittent rotation/constant dimension rotation or other rotation scheme, and the rotation speed. In addition, the control device 14 controls the linear slider 222 to set/adjust the ON/OFF timing, movement amount, and movement speed of the forward/backward movement of the transfer mechanism main body 221 of the transfer mechanism 22. The control device 14 also controls the vacuum motors 224 to set/adjust the timing of gripping/releasing and raising/lowering the gripping mechanisms 223.

Figure 8A:
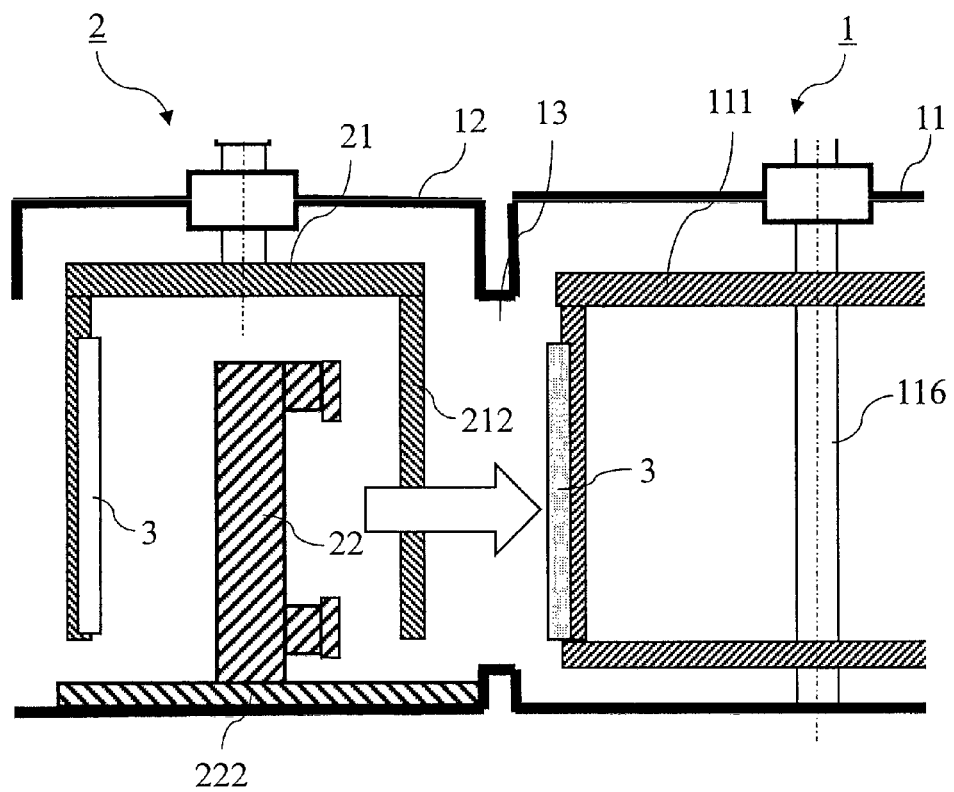
FIG. 8A is a side view (Part 1) illustrating a procedure for transferring an object.

A procedure for replacing film deposition substrates 3 using the film deposition apparatus 1 of the present embodiment will then be described. FIGS. 8A to 8G are side views illustrating a procedure for replacing a film deposition substrate 3. The initial state illustrated in FIG. 8A is from a standby state in which the film deposition process in the film deposition chamber 11 is completed and the work of attaching a film deposition substrate 3 before film deposition to holding units 212 of the rotating body 21 in the auxiliary chamber 12 is completed to a state in which the partition valve 13 is opened (the airtight door 121 of the auxiliary chamber 12 is closed) and the atmospheric pressure in the film deposition chamber 11 and the atmospheric pressure in the auxiliary chamber 12 are the same. As illustrated in the plan view of FIG. 1, the carousel drum 111 of the film deposition chamber 11 holds eight film deposition substrates 3 for which film deposition has been completed, and the holding units 212 of the rotating body 21 of the auxiliary chamber 12 hold eight film deposition substrates 3 before film deposition.

In FIG. 1, among the eight holding units of the carousel drum 111 of the film deposition chamber 11, a position that faces the partition valve 13 and corresponds to the forward position of the transfer mechanism 22 of the transfer apparatus 2 will be referred to as a transfer position P1 of the carousel drum 111, and among the nine holding units 212 of the rotating body 21 of the auxiliary chamber 12, a position that faces the partition valve 13 and corresponds to the backward position of the transfer mechanism 22 of the transfer apparatus 2 will be referred to as a transfer position P2 of the rotating body 21. The position of the carousel drum 111 in the rotational direction may be detected, for example, by a position detection sensor (not illustrated) and output to the control device 14 or may also be obtained by referring to the data set of the servomotor. Additionally or alternatively, the detection position may be physically determined by a pressing mechanism (not illustrated). Likewise, the position of the rotating body 21 in the rotational direction is determined by the same method.

In the initial state in which the film deposition in the film deposition chamber 11 is completed and the rotating body 21 to which the film deposition substrates 3 before film deposition are attached is set in the auxiliary chamber 12, the rotational position of the rotating body 21 is controlled so that, as illustrated in the plan view of FIG. 1, the holding units 212 corresponding to the transfer position P2 are vacant. In the case of a rotating body 21 provided with 10 or more holding units 212, any of two or more vacancies may be set at the transfer position P2 because it suffices that one or more vacancies are present between the corresponding holding units 212 of the rotating body 21 when the replacement of a film deposition substrate 3 is started.

Figure 8B:
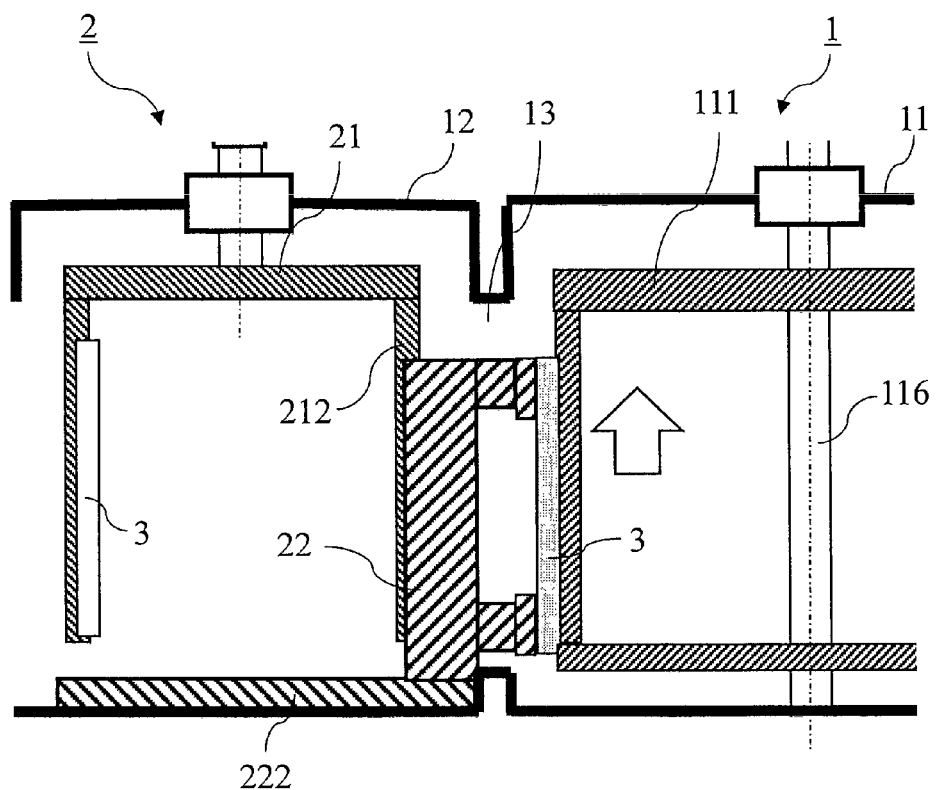
FIG. 8B is a side view (Part 2) illustrating a procedure for transferring an object.

Under such a precondition, the transfer mechanism 22 holding nothing on the gripping mechanisms 223 is moved forward by the linear slider 222 from the backward position (original position) illustrated in FIG. 8A to the forward position illustrated in FIG. 8B. In this operation, the pair of upper and lower pins 228 of the transfer mechanism 22 are set to the open positions (non-clamping positions) illustrated in the left figure of FIG. 7, and the pair of upper and lower gripping mechanisms 223 are set to the downward positions.

In the state illustrated in FIG. 8B, the gripping mechanisms 223 of the transfer mechanism 22 are in the state illustrated in the middle figure of FIG. 7 with respect to the film deposition substrate 3 held at the transfer position P1 of the carousel drum 111; therefore, the pair of upper and lower vacuum motors 224 are synchronously driven to bring the pair of upper and lower sliders 226 close to each other, and the pins 228 of the gripping mechanisms 223 are set to the closed positions (clamping positions). This allows the pins 228 of the gripping mechanisms 223 to engage with the second holes 35 of the film deposition substrate 3. Then, to release the film deposition substrate 3 engaged with the pins (not illustrated) of the holding units of the carousel drum 111, the pair of upper and lower vacuum motors 224 are synchronously driven to move the pair of upper and lower sliders 226 in the same upward direction. This allows the film deposition substrate 3 held by the holding units of the carousel drum 111 to be released, and the transfer mechanism 22 is therefore moved backward by the linear slider 222 as illustrated in FIG. 8C while maintaining the upward positions.

Figure 8C:
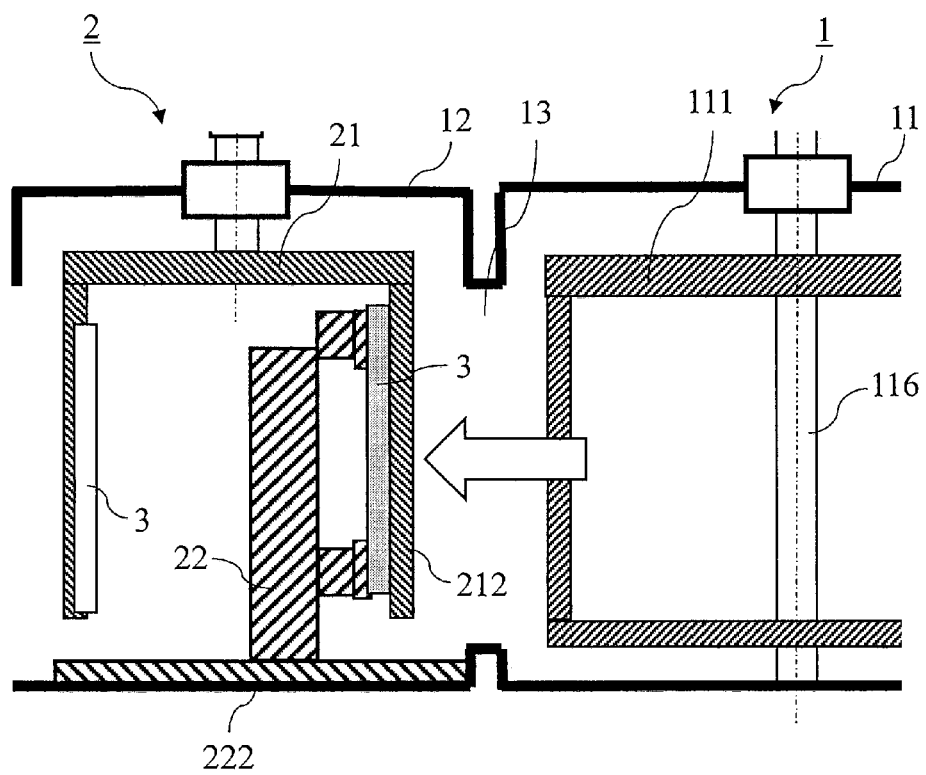
FIG. 8C is a side view (Part 3) illustrating a procedure for transferring an object.
Figure 8D:
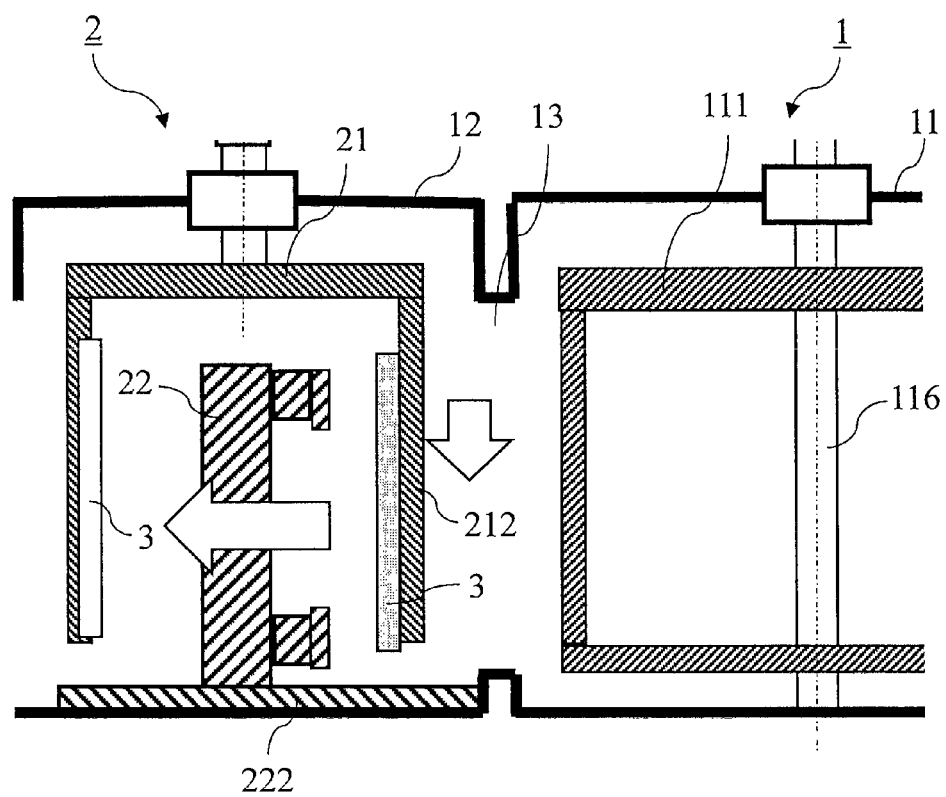
FIG. 8D is a side view (Part 4) illustrating a procedure for transferring an object.

The position illustrated in FIG. 8C represents the transfer position P2 of the rotating body 21, which is made vacant and at which the film deposition substrate 3 after film deposition gripped by the gripping mechanisms 223 is located, that is, represents the state illustrated in the middle figure of FIG. 5. Then, the pair of upper and lower vacuum motors 224 are synchronously driven to move the pair of upper and lower sliders 226 in the downward direction, and as illustrated in the right figure of FIG. 5, the film deposition substrate 3 after film deposition gripped by the gripping mechanisms 223 is held by the holding units 212 of the rotating body 21. Subsequently, to release the clamping by the pins 228 of the gripping mechanisms 223, the pair of upper and lower vacuum motors 224 are synchronously driven to separate the pair of upper and lower sliders 226 from each other, and as illustrated in the middle figure of FIG. 7, the pins 228 of the gripping mechanisms 223 are pulled out from the second holes 35 of the film deposition substrate 3. Then, the transfer mechanism 22 is moved backward to the original position by the linear slider 222. This state is illustrated in FIG. 8D. Through the above operations, the film deposition substrate 3 after film deposition held at the transfer position P1 of the carousel drum 111 is transferred to the vacant holding units 212 corresponding to the transfer position P2 of the rotating body 21.

Then, the rotating body 21 is subjected to index rotation (constant dimension rotation) so that a film deposition substrate 3 before film deposition is located at the transfer position P2, and subsequently, the transfer mechanism 22 holding nothing on the gripping mechanisms 223 is moved forward by the linear slider 222 from the backward position (original position) illustrated in FIG. 8D to the forward position illustrated in FIG. 8E. In this operation, the pair of upper and lower pins 228 of the transfer mechanism 22 are set to the open positions (non-clamping positions) illustrated in the left figure of FIG. 7, and the pair of upper and lower gripping mechanisms 223 are set to the downward positions.

Figure 8E:
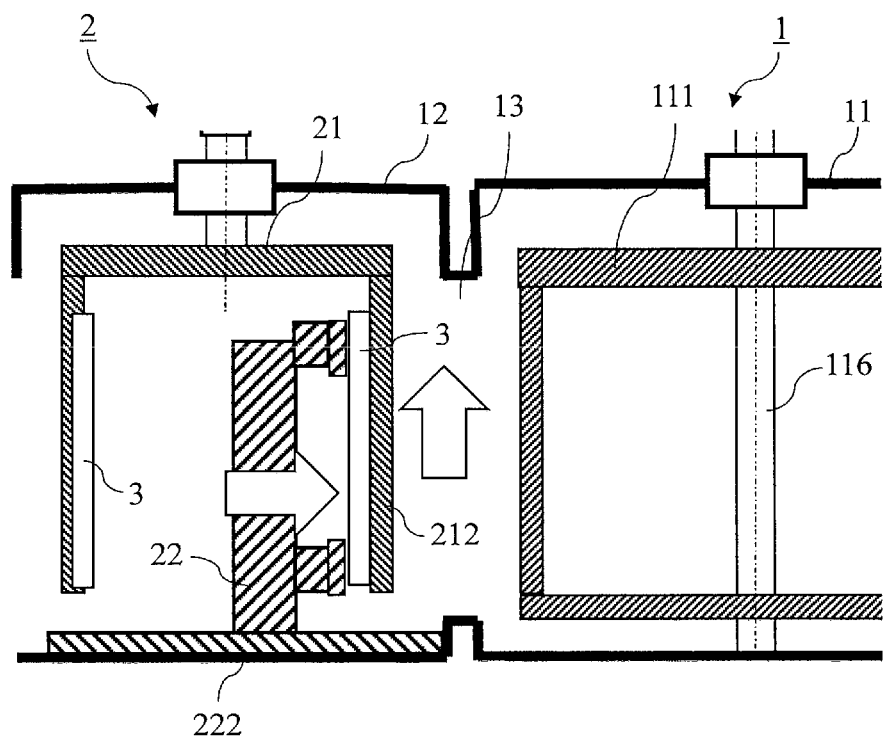
FIG. 8E is a side view (Part 5) illustrating a procedure for transferring an object.

In the state illustrated in FIG. 8E, the gripping mechanisms 223 of the transfer mechanism 22 are in the state illustrated in the middle figure of FIG. 7 with respect to the film deposition substrate 3 held at the transfer position P2 of the rotating body 21; therefore, the pair of upper and lower vacuum motors 224 are synchronously driven to bring the pair of upper and lower sliders 226 close to each other, and the pins 228 of the gripping mechanisms 223 are set to the closed positions (clamping positions). This allows the pins 228 of the gripping mechanisms 223 to engage with the second holes 35 of the film deposition substrate 3. Then, to release the film deposition substrate 3 engaged with the pins 214 of the holding units 212 of the rotating body 21, the pair of upper and lower vacuum motors 224 are synchronously driven to move the pair of upper and lower sliders 226 in the same upward direction. This allows the film deposition substrate 3 held by the holding units 212 of the rotating body 21 to be released, and the transfer mechanism 22 is therefore moved further forward by the linear slider 222 as illustrated in FIG. 8F while maintaining the upward positions.

Figure 8F:
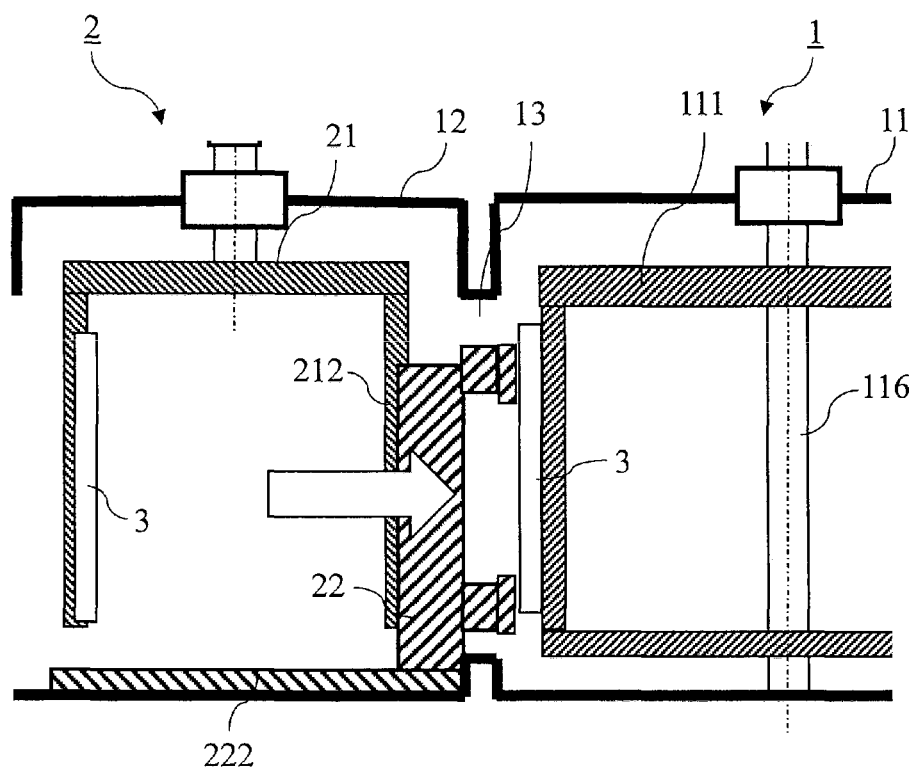
FIG. 8F is a side view (Part 6) illustrating a procedure for transferring an object.
Figure 8G:
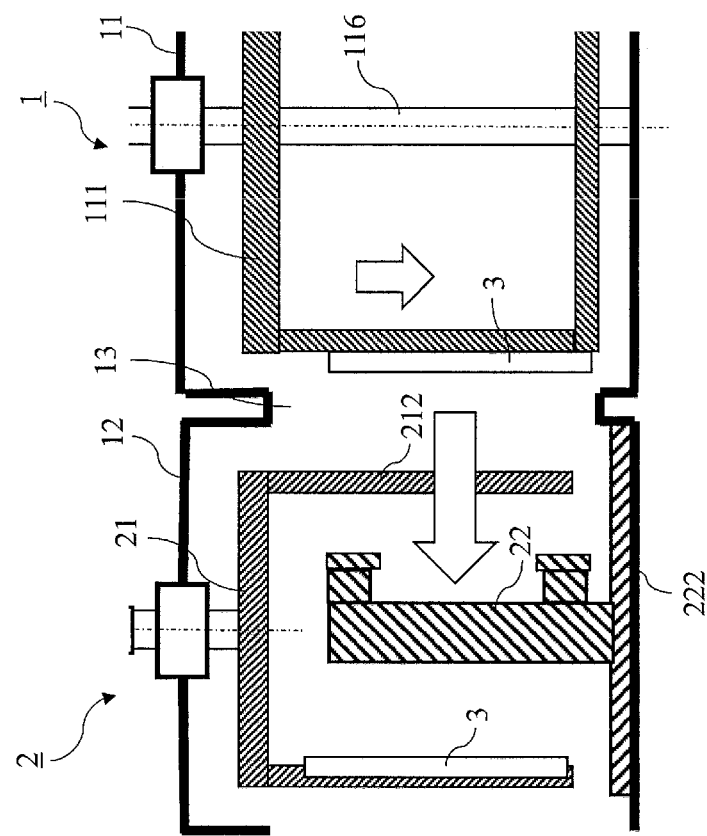
FIG. 8G is a side view (Part 7) illustrating a procedure for transferring an object.

The position illustrated in FIG. 8F is a position at which the film deposition substrate 3 before film deposition gripped by the gripping mechanisms 223 arrives at the transfer position P1 of the carousel drum 111, which is in the state illustrated in the middle figure of FIG. 5. This transfer position P1 is a position illustrated in FIGS. 8A to 8B at which the film deposition substrate 3 after film deposition transferred earlier has been held, and is currently vacant. Then, the pair of upper and lower vacuum motors 224 are synchronously driven to move the pair of upper and lower sliders 226 in the downward direction, and as illustrated in the right figure of FIG. 5, the film deposition substrate 3 before film deposition gripped by the gripping mechanisms 223 is held by the holding units of the carousel drum 111. Subsequently, to release the clamping by the pins 228 of the gripping mechanisms 223, the pair of upper and lower vacuum motors 224 are synchronously driven to separate the pair of upper and lower sliders 226 from each other, and as illustrated in the middle figure of FIG. 7, the pins 228 of the gripping mechanisms 223 are pulled out from the second holes 35 of the film deposition substrate 3. Then, the transfer mechanism 22 is moved backward to the original position by the linear slider 222. This state is illustrated in FIG. 8G. Through the above operations, the film deposition substrate 3 before film deposition held at the transfer position P2 of the rotating body 21 is transferred to the vacant holding units corresponding to the transfer position P1 of the carousel drum 111.

Then, the carousel drum 111 is subjected to index rotation (fixed dimension rotation) so that a film deposition substrate 3 after film deposition is located at the transfer position P1, and thereafter the operations of FIGS. 8A to 8G are repeated until all of the remaining film deposition substrates 3 attached to the holding units 212 of the rotating body 21 are transferred to the holding units of the carousel drum 111. In the operation of transitioning from the state illustrated in FIG. 8F to the state illustrated in FIG. 8G, the position to which the transfer mechanism 22 is moved backward by the linear slider 222 after the film deposition substrate 3 before film deposition is attached to the holding units of the carousel drum 111 is not limited to the original position illustrated in FIG. 8G, and the transfer mechanism 22 may stands by in mid-course.

As described above, according to the film deposition apparatus 1 using the transfer apparatus 2 of the present embodiment, the auxiliary chamber 12 which can be set to the same atmosphere as that in the film deposition chamber 11 is provided separately from the film deposition chamber 11, and the film deposition substrates 3 can therefore be replaced without returning the atmosphere in the film deposition chamber 11 to the air atmosphere. It is therefore possible to prevent dew condensation in the film deposition chamber 11 that occurs when the atmosphere is returned to the air atmosphere as compared with the batch-type film deposition apparatus. Moreover, the film deposition substrates 3 can be replaced while maintaining the atmosphere in the film deposition chamber 11, and it is therefore possible to transition to the film deposition process without any additional process after the replacement. It can thus be said that the productivity is high because the evacuation time at the time of resuming the film deposition is unnecessary or can be remarkably shortened as compared with the batch-type film deposition apparatus.

Furthermore, according to the film deposition apparatus 1 using the transfer apparatus 2 of the present embodiment, the auxiliary chamber 12 which can be set to the same atmosphere as that in the film deposition chamber 11 is provided separately from the film deposition chamber 11 and only the film deposition substrates 3 are replaced between the film deposition chamber 11 and the auxiliary chamber 12; therefore, the size of the partition valve 13 can be reduced as compared with the case of replacing the carousel drum 111 together with the film deposition substrates 3. As a result, the evacuation time can be shortened because the film deposition chamber 11 and the auxiliary chamber 12 can also be reduced in size.

In addition, according to the film deposition apparatus 1 using the transfer apparatus 2 of the present embodiment, the operations of the transfer apparatus 2 are limited to the forward/backward movement of the transfer mechanism main body 211 by the linear slider 212 and gripping/releasing and raising/lowering operations of the gripping mechanisms 223 by the vacuum motors 224; therefore, the operations are simple, and the time required for the replacement operation for the film deposition substrates 3 is shortened. Moreover, such simple operations can suppress the occurrence of a failure because it is possible to prevent an unreasonable load from acting on the linear sliders 212, the vacuum motors 224, or other operating portions.

Figure 9:
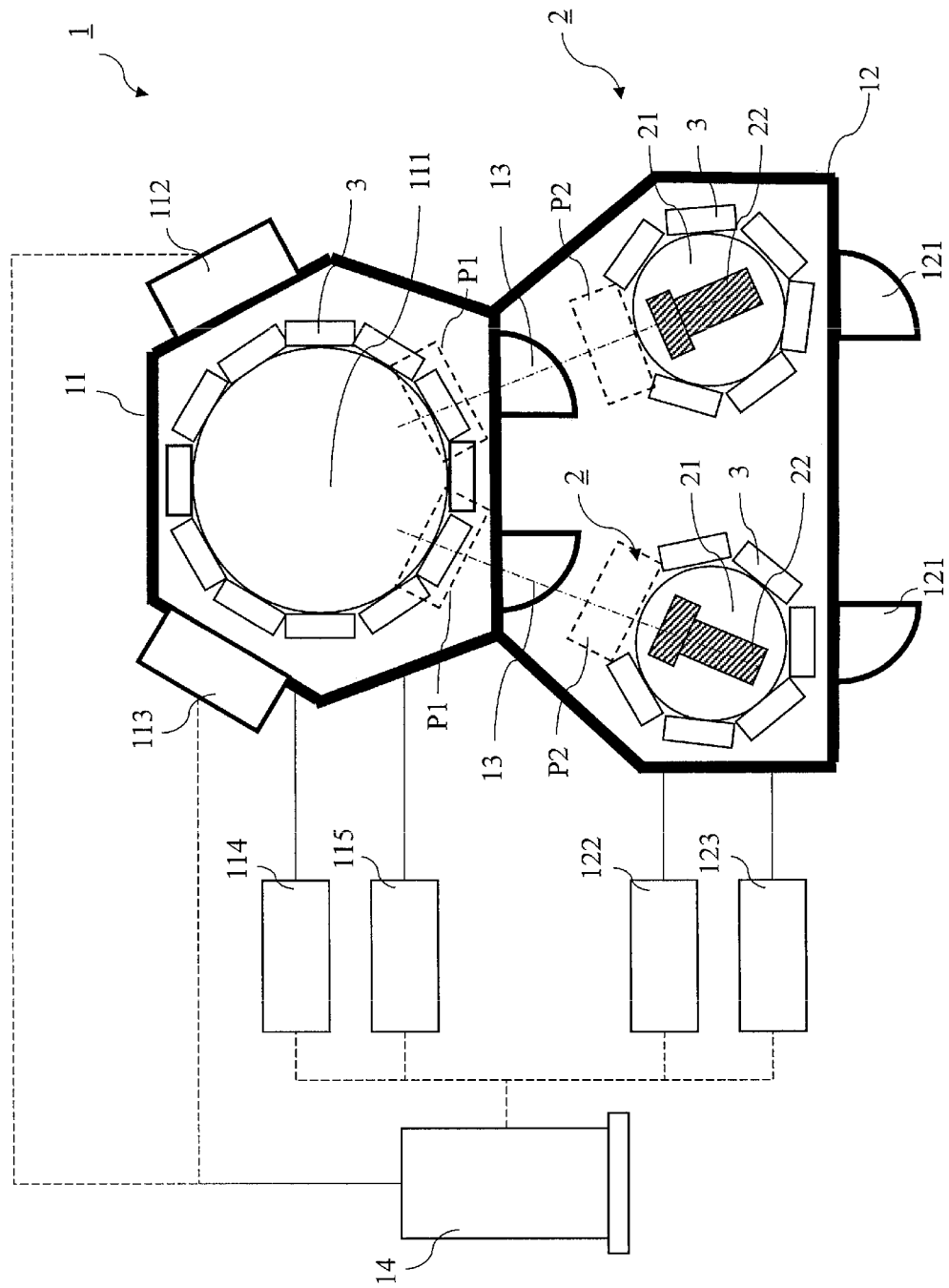
FIG. 9 is a plan view illustrating another embodiment of a film deposition apparatus using transfer apparatuses according to the present invention.

The film deposition apparatus using the transfer apparatus according to the present invention is not limited to the above-described embodiment and can be variously modified. FIG. 9 is a plan view illustrating another embodiment of a film deposition apparatus using transfer apparatuses according to the present invention. The present embodiment is different from the above-described embodiment in that the auxiliary chamber 12 is provided with a plurality of transfer apparatuses 2 and a plurality of partition valves 13 is provided accordingly.

That is, in the film deposition apparatus 1 illustrated in FIG. 9, the carousel drum 111 of the film deposition chamber 11 holds 12 film deposition substrates 3 and the auxiliary chamber 12 is provided with two transfer apparatuses 2 each having seven holding units 212. The holding units 212 of each transfer apparatus 2 hold six film deposition substrates 3 before film deposition. Transfer positions P1 of the carousel drum 111 are set to respective positions facing the two partition valves 13, and transfer positions P2 of rotating bodies 21 are also set to respective positions facing the two partition valves 13. The film deposition substrates 3 are replaced at the same time by the transfer apparatuses 2. This replacement procedure is as described above. The film deposition substrates 3 are replaced at the same time by the plurality of transfer apparatuses 2, and therefore the replacement time is significantly reduced to nearly half.

The above carousel drum 111 corresponds to the predetermined device according to the present invention, the above film deposition substrates 3 correspond to the object according to the present invention, the above servomotor 125 corresponds to the first drive unit according to the present invention, the above linear slider 222 and the above vacuum motors 224 correspond to the second drive unit according to the present invention, and the above control device 14 corresponds to the control unit according to the present invention.

DESCRIPTION OF REFERENCE NUMERALS

1 Film deposition apparatus
  11 Film deposition chamber
    111 Carousel drum (predetermined device)
    112 Sputtering electrode
    113 Sputtering electrode
    114 Evacuation device
    115 Gas supply device
    116 Drum shaft
    117 Servomotor
    118 Decelerator 119 Magnetic seal unit
12 Auxiliary chamber
　121 Airtight door
　122 Evacuation device
　123 Leak valve
　124 Rotating body shaft
　125 Servomotor (first drive unit)
　126 Decelerator
　127 Magnetic seal unit
13 Partition valve
14 Control device
2 Transfer apparatus
　21 Rotating body
　　211 Rotating body main body
　　212 Holding unit
　　213 Plate
　　214 Pin
　22 Transfer mechanism
　　221 Transfer mechanism main body
　　222 Linear slider (second drive unit)
　　223 Gripping mechanism
　　224 Vacuum motor (second drive unit)
　　225 Actuator unit
　　226 Slider
　　227 Spring
　　228 Pin
3 Film deposition substrate (object)
　31 Main body
　32 First rib
　33 Second rib
　34 First hole
　35 Second hole
　36 Cutout portion

The invention claimed is:

1. A transfer apparatus for a film deposition apparatus comprising a film deposition chamber that applies a predetermined surface treatment to an object and an auxiliary chamber that is spatially isolated from the film deposition chamber, the transfer apparatus comprising:
a rotating body configured to be rotatable and provided with a holding unit that is provided in the auxiliary chamber which is provided with an evacuation device for adjusting an inside thereof to a predetermined degree of vacuum, and holds the object to be transferred in an attachable and detachable manner, the holding unit being provided along an outer peripheral portion of the rotating body; and
a transfer mechanism having a gripping mechanism capable of gripping and releasing the object, the transfer mechanism transferring the object held in the film deposition chamber which is provided with an evacuation device for adjusting an inside thereof to a predetermined degree of vacuum to the holding unit of the rotating body and transferring another object held by the rotating body to the film deposition chamber.

2. The transfer apparatus according to claim 1, wherein the holding unit has a plurality of pins extending along an attachment/detachment direction of the object, and the object has:
a plurality of holes that engage with the pins; and
a cutout portion for avoiding interference with the holding unit, the cutout portion having a cutout length equal to or longer than an engagement length between the pins and the holes.

3. The transfer apparatus according to claim 1, wherein the rotating body has a uniaxial structure in which a rotating body shaft suspends in a vertical direction, and the holding unit is provided to suspend vertically from an outer peripheral portion of the rotating body so that a part or whole of the transfer mechanism gripping the object can pass through a space between the holding unit and another holding unit.

4. The transfer apparatus according to claim 1, further comprising:
a first drive unit that rotationally drives the rotating body;
a second drive unit that drives the transfer mechanism; and
a control unit that controls the first drive unit and the second drive unit,
wherein the control unit controls the first drive unit and the second drive unit to:
transfer the object held at a transfer position of a holder provided in the film deposition chamber to a transfer position of the holding unit of the rotating body;
subject the rotating body to index rotation;
transfer the object held at the transfer position of the holding unit of the rotating body to the transfer position of the holder; and
subject the holder to index rotation.

5. A film deposition apparatus comprising:
a film deposition chamber that is provided with an evacuation device for adjusting an inside thereof to a predetermined degree of vacuum and has a holder for holding an object and applies a predetermined surface treatment to the object held by the holder;
an auxiliary chamber that is provided with an evacuation device for adjusting an inside thereof to a predetermined degree of vacuum and is spatially isolated from the film deposition chamber via a partition valve; and
the transfer apparatus according to claim 1.

6. The film deposition apparatus according to claim 5, wherein the auxiliary chamber is provided with a plurality of transfer apparatuses.

7. The film deposition apparatus according to claim 5, wherein in the auxiliary chamber, a same surface treatment as the predetermined surface treatment or other surface treatment is applied to the object held by the holding unit.

* * * * *